United States Patent [19]

Seliger et al.

[11] 4,158,141

[45] Jun. 12, 1979

[54] PROCESS FOR CHANNELING ION BEAMS

[75] Inventors: Robert L. Seliger, Agoura, Calif.; Paul A. Sullivan, Stuttgart, Fed. Rep. of Germany

[73] Assignee: Hughes Aircraft Company, Culver City, Calif.

[21] Appl. No.: 917,610

[22] Filed: Jun. 21, 1978

[51] Int. Cl.² ............................................. A61K 27/02
[52] U.S. Cl. .............................. 250/492 A; 250/492 B
[58] Field of Search ...................... 250/492 A, 492 B; 148/1.5; 357/91

[56] References Cited

PUBLICATIONS

"Electrical Activation Processes . . ." by Cembali et al., Radiation Effects, 1975, vol. 26, pp. 161-171.
"Effects of Ion Implantation . . ." by A. J. Learn et al., Journal of Applied Physics, vol. 48, No. 1, Jan. 1977, pp. 308-311.
"Measurement of Lateral Spread . . ." by W. A. Grant et al., Radiation Effects, 1976, vol. 29, pp. 189-190.

*Primary Examiner*—Harold A. Dixon

*Attorney, Agent, or Firm*—Mary E. Lachman; W. J. Bethurum; W. H. MacAllister

[57] ABSTRACT

The specification describes a process for minimizing ion scattering and thereby improving resolution in ion beam lithography. First, a substrate coated with a layer of ion beam resist is provided at a chosen spaced distance from an ion beam source. Next, a monocrystalline membrane with a patterned ion absorption region is positioned at a predetermined location between the substrate target and the ion beam source. The patterned ion absorption region may be either an ion absorption mask, such as gold, deposited on the surface of the monocrystalline membrane, or a pattern of ion-damaged regions within the monocrystalline membrane. Finally, a collimated wide area ion beam is passed perpendicular to the surface of the membrane and through crystal lattice channels therein which are exposed by the patterned ion absorption region and which extend perpendicular to the membrane surface. The parallel paths established by the channels in the membrane provide low resistance paths to the passage of ion beams and consequently minimize the angle of deflection of the ions passing from the membrane to the target resist layer.

9 Claims, 4 Drawing Figures

PROCESS FOR CHANNELING ION BEAMS

FIELD OF THE INVENTION

This invention relates generally to micropattern generation and replication techniques and more particularly to a novel process for forming a high resolution resist pattern on selected substrates using ion beam lithography.

BACKGROUND OF THE INVENTION

The utilization of collimated ion beams to expose certain known and commercially available polymer (resist) materials is generally known in the art of ion beam lithography and is disclosed, for example, in an article entitled "Focused Ion Beams in Microfabrication", R. L. Seliger and W. P. Fleming in *The Journal of Applied Physics*, Vol. 45, No. 3, March 1974. In many wafer processing operations, ion beam lithography is preferred over electron beam lithography and photolithography because of the reduced resist exposure times made possible by the use of ion beams.

To achieve optimum resolution during the selective ion implantation of certain ion species into layers of resist, care should be taken to minimize the scattering or dispersion of the ion beams as they are selectively masked in the ion beam path between the source of ions and the supporting wafer or substrate upon which the ion beam resist is deposited. Thus, by minimizing the scatter angle of the ion beam during its passage through selective masking materials, one can correspondingly minimize certain device line widths, such as the gate width (length, $L_g$,) on a high frequency field effect transistor.

The minimization of the scatter angle ($\theta$) of transmitted ion beams is particularly important when use is made of off-contact lithographic processes in which there is a space, S, between the transmission mask and the target resist. For a given value of $\theta$, the magnitude of the lateral deflection observed at the target increases with an increase in the space S. However, it is desirable in an off-contact process to have a significant space S between the mask and the target in order to prevent the mask from becoming contaminated, which in turn, allows multiple use of the same mask without cleaning after each use. In addition, it is advantageous to use an off-contact process because it provides a large area exposure technique which is often necessary to satisfy large-scale production requirements. Thus, it is desirable to use an off-contact process having the maximum attainable distance between the mask and the target resist, while at the same time minimizing the scatter angle of the ions transmitted through the mask, thereby producing a well-replicated, high resolution resist pattern. Transistor gate lengths of 0.5 micrometers are now desirable, but not yet attainable, in many X-band and higher frequency field effect transistors. Thus, the desirability of even further improving the above ion beam resolution and minimizing ion scattering is manifest.

One technique which has been used successfully to improve these above characteristics is disclosed and claimed in my allowed copending application, Ser. No. 794,288, assigned to the present assignee. In this copending application, a hyperthin taut amorphous membrane of a material such as aluminum oxide ($Al_2O_3$) is used as the support member for an ion absorption mask. The mask is aligned with a target substrate having a layer of resist thereon, and ions are projected onto the mask and are transmitted through selected area of the hyperthin $Al_2O_3$ membrane which are exposed by patterned openings in the ion absorption material. The transmitted ions strike the resist-covered substrate and thereby expose predefined areas therein. Using this process, the accelerated ions have a very minimum of mask particles to pass through relative to prior art processes. Consequently, this approach provides substantial improvements in minimizing ion scattering and thus improving resolution in the art of ion beam lithography.

THE INVENTION

The general purpose of the present invention is to provide yet even further new and improved processes for minimizing ion scattering and thereby further improving the resolution in resist development or the like in the art of ion beam lithography.

To accomplish this purpose, we have discovered and therefore developed a process for interrupting an ion beam while minimizing the lateral deflection thereof. This process comprises passing a collimated ion beam through selected areas of a thin monocrystalline membrane. By this process, the resistance of the atomic lattice to the ion transmission is minimized. In a specific embodiment of this invention, we have discovered an improved ion lithographic process for controlling ion beam directionality during the selective implantation of certain ion species into layers of ion beam resist, semiconductors, or other suitable target materials. This process includes, among other things, initially providing a thin monocrystalline membrane of less than 2 micrometers in thickness and having a patterned ion absorbing region adjacent to one surface thereof. Next, a collimated ion beam is projected toward and perpendicular to the membrane and through openings in the ion absorbing pattern. The monocrystalline characteristics of the membrane serve to minimize the resistance of the membrane to the transmission of the ions passing therethrough. Consequently, there is a minimal lateral deflection and scattering of the ion beam relative to its initial direction of movement, and this produces an attendant enhancement of the resolution at the target upon which the uninterrupted ions impinge.

Accordingly, it is an object of the present invention to provide a new and improved process for interrupting a collimated ion beam in a predetermined pattern in a manner that minimizes the scatter angle and lateral deflection of the uninterrupted ions.

Another object is to provide a new and improved process for achieving a high resolution pattern in a resist material using ion beam lithography.

Still another object is to provide a process of the type described in which the travel distance and deflection of the ions through the lithographic mask is minimized and the ion transmission through the mask is maximized.

A further object of the present invention is to provide a new and improved process for controlling ion beam directionality during the selective implantation of certain ion species into layers of ion beam resist materials.

The foregoing and other objects and advantages of the present invention will be apparent from the following more particular description of the preferred embodiments of the invention, as illustrated in the accompanying drawings.

DESCRIPTION OF THE PREFERRED EMBODIMENTS

Figure 1:
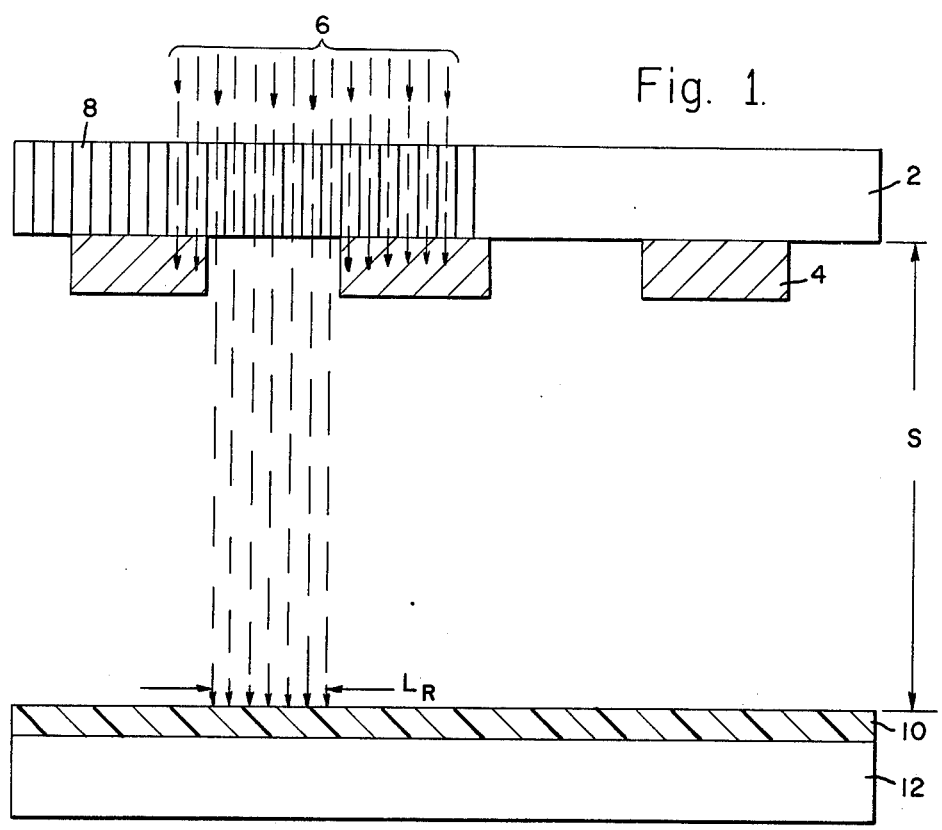
FIG. 1 illustrates in schematic cross-section the method of use of one embodiment of the invention.

Referring now to FIG. 1, there is shown a channeling transmission mask structure comprising a thin (typically less than 2 micrometers) membrane 2 of a monocrystalline material such as (110) silicon (i.e. a silicon wafer cut on its (110) crystallographic plane) and a patterned layer 4 of an ion-absorbing, heavy metal, such as gold which is adhered to the layer 2 and which is typically 0.5 to 1.0 micrometer thick. A collimated wide area ion beam 6 is aligned with the channels 8 in the mask, which are perpendicular to the surface of the mask, and is projected onto the surface of the mask. As the projected ions travel through the membrane 2, they are guided along channels 8, normal to the surface of the mask, and encounter minimal resistance to their movement. In the areas of the mask which are not covered by the ion-absorber layer 4, the ions emerge from the mask with a minimized angle of deflection. For purposes of simplification, the deflection of the emerging ions is not shown in FIG. 1, but is described in more detail in FIG. 3. The emerging ions travel the distance S shown in FIG. 1 between the mask and the target and finally strike the target resist layer 10 which typically is deposited upon a semiconductor wafer 12.

Figure 2:
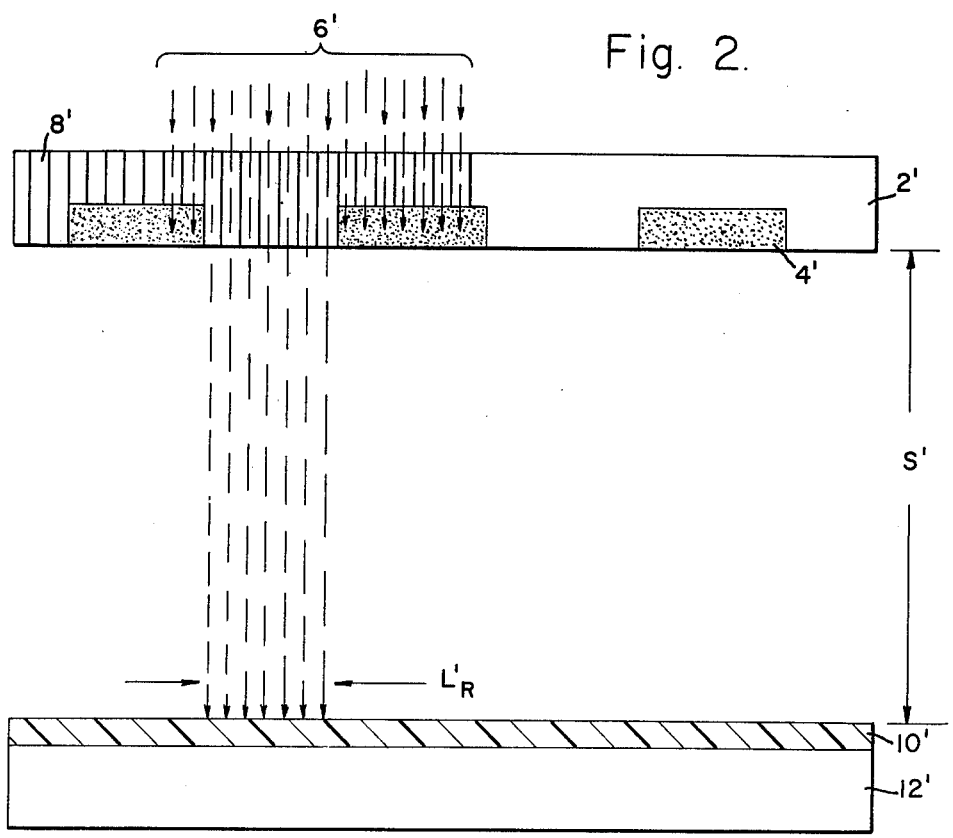
FIG. 2 illustrates in schematic cross-section the method of use of a second embodiment of the invention.

Turning now to FIG. 2, there is shown a channeling transmission mask structure comprising a thin membrane 2' of a monocrystalline material, such as (110) silicon, and a pattern of damaged crystal regions 4' which act as ion-absorbing regions and which may be formed by bombardment of a (110) silicon wafer with heavy ions such as argon. In a manner similar to that described for FIG. 1, a collimated wide area ion beam 6' is aligned with the channels 8' in the mask and is projected onto the surface of the mask. In the areas of the membrane which do not have crystal damage, the ions emerge from the mask with a minimized angle of deflection. For purposes of simplification, the deflection of the emerging ions is not shown in FIG. 2, but is described in more detail in FIG. 3. The emerging ions travel the distance S' shown in FIG. 2 and strike the target resist layer 10' which is deposited upon a wafer 12'.

Figure 3:
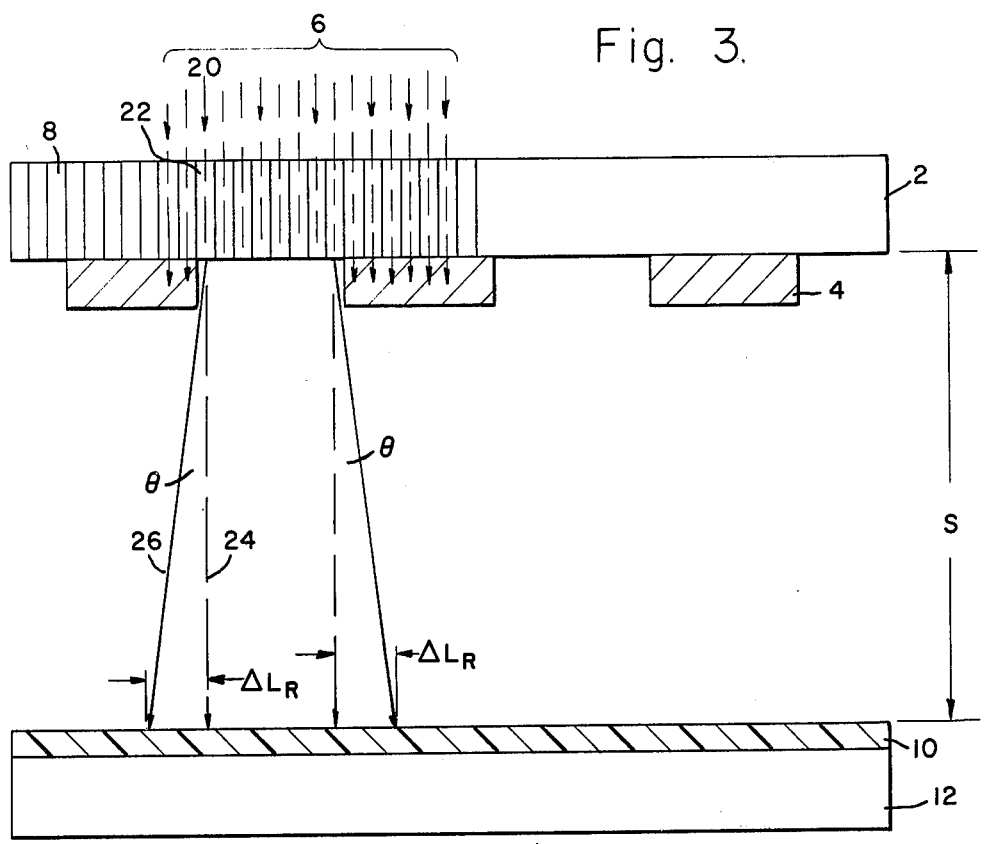
FIG. 3 presents a detailed description of the scatter angle of the transmitted ions using the novel process to be described.

In FIG. 3 there is shown a simplified version of FIG. 1 so that the scatter angle $\theta$ or angle of deflection of the projected ion beam may be defined. FIG. 3 is the same as FIG. 1 except that FIG. 3 shows the transmission of only two ion beams, one at each of the lateral extremes of one opening in the mask structure. It is to be understood, although not indicated in FIG. 3, that additional ion beams are similarly transmitted with a scatter angle $\theta$ through the other openings in the mask 4. If the ion beam 20 shown in FIG. 3 encountered no resistance to its passage through the channel 22 in the mask structure, it would emerge along the path 24. However, during the passage of the ion beam 20 through the channels in the mask, the ions do experience some minimum resistance to their motion, mostly due to interaction with the electron clouds associated with the atomic nuclei in the silicon membrane 2. Thus, the ion beam 26 that emerges is deflected by the angle $\theta$ from its original direction of motion. This scatter angle $\theta$, in turn, determines the actual line width which may be achieved and which is measured by $L_R + 2\Delta L_R$, where $L_R$ is the line resolution and $\Delta L_R$ is the change in $L_R$ due to ion scattering, occurring in two lateral directions.

As previously discussed, it is desirable to have a large distance S between the transmission mask and the target resist, while at the same time minimizing the scatter angle $\theta$. For the production of the devices currently required, a $\Delta L_R$ of 0.1 micrometer is desired, and for this purpose, it is necessary that S be greater than 10 microns, with 50 microns being highly desirable. Turning now to FIG. 3, it will be seen that tangent $\theta = \Delta L_R / S$, and since $\theta$ is a small angle, $\theta \cong \Delta L_R / S$ For $\Delta L_R = 0.1$ μm and $S = 10$ μm, $\theta = 0.1/10 = 0.01$ radian $= 0.6$ degree For $\Delta L_R = 0.1$ μm and $S = 50$ μm, $\theta = 0.1/50 = 0.002$ radian $= 0.12$ degree Thus, a scatter angle between 0.12 degree and 0.6 degree is required for present technological applications. Angles of this diminutive size which are difficult to achieve by prior art processes, can be more easily achieved, it is believed, only by using the subject invention.

The reduced scattering of the channeling mask can be profited by in two ways. The values given above for the scatter angle apply for a mask of (100) silicon. Using (110) silicon which has three times more opened channels for the mask, the same $\theta$ would be obtained for a mask having three times the thickness as the (100) silicon; or using the same mask thickness as the (100) silicon, the $\theta$ produced would be one-third that produced by the (100) silicon mask.

Figure 4:
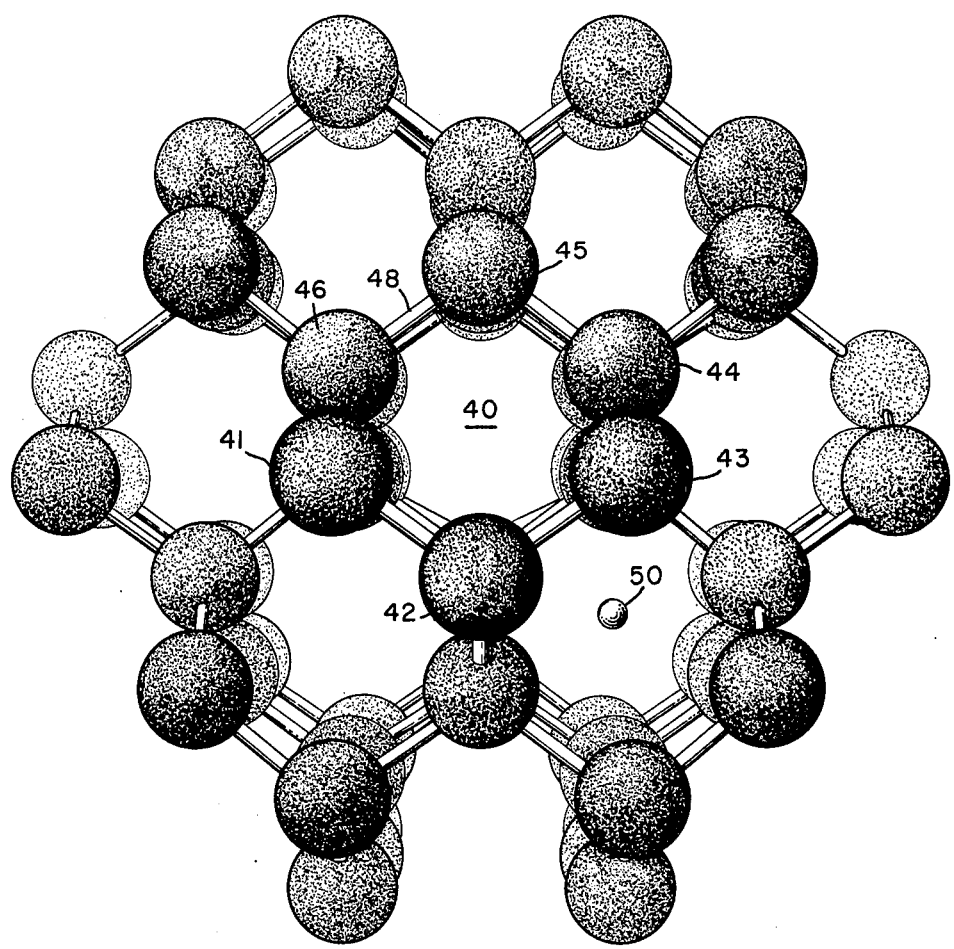
FIG. 4 presents a perspective view of the crystal structure of (110) silicon, normal to the plane of the mask in order to demonstrate the depth perception of the atomic lattice.

FIG. 4 presents a graphic representation of the structure of a silicon crystal which has been cut along the (110) plane, as viewed perpendicular to the surface of the structure. The atoms in a silicon lattice are arranged in a face-centered cubic structure, as further defined in "Physics of Semiconductor Devices," by S. M. Sze, Wiley-Interscience, New York, 1969, pages 12–17. When the crystal lattice is oriented along the (110) plane, a hexahedral column of space is defined by the silicon atoms and their associated interatomic bonds. FIG. 4 shows several such hexahedral columns. Considering one hexahedral column 40 in particular, silicon atoms 41 through 46 and their associated bonds define the boundaries of the hexahedron. Atoms 41, 42, and 43 lie on the same place with each other and are on the cut surface of the crystal which has been cut along the (110) plane. Atoms 44, 45, and 46 lie on the same plane with each other but are removed from the plane of atoms 41, 42, and 43 by a distance equal to the length of the interatomic bond 48, in the direction away from the viewer. This pattern is repeated throughout the crystal in three dimensions, to give rise to the aggregate of hexahedral columns of space indicated in FIG. 4. The (110) crystal orientation described provides the maximum space between atoms in the crystal lattice and the maximum lattice vacency per unit area of all the crystal planes defined by the well-known Miller indices. Consequently, this (110) orientation offers minimum resistance to the passage of ions, such as ion 50, through the interatomic spaces, similar to column 40, in the direction perpendicular to the plane of the figure.

In practicing the present invention, a mask of the type described in FIG. 1 using (100) Si and having an $L_R$ of 2.5 microns is positioned a distance "S" of between 10 microns and 50 microns from a resist-covered substrate target. A collimated beam of protons having an accelerating voltage of 300KeV is projected perpendicular to the surface of the mask. The minimized deflection of the transmitted ions is indicated by the low value of $\Delta L_R$ (i.e. $\Delta L_R = 0.1$ micrometer) associated with the line width of the pattern exposed on the resist by the transmitted ions.

While the invention has been particularly described with respect to the preferred embodiments thereof, it will be recognized by those skilled in the art that certain modifications in form and detail may be made without departing from the spirit and scope of the invention. In particular, the scope of the invention is not limited to ion beam lithography, but is intended to include any interruption of an ion beam and specifically, the selective implantation of ions into a substrate for purposes of impurity doping. The present invention further includes the use of any monocrystalline membrane which is crystallographically oriented so as to minimize atomic lattice resistance to ions passing therethrough, in a manner similar to that described herein. Additionally, the ion absorption material is not limited to the use of gold, and instead may use other suitable high atomic number metals such as tungsten and molybdenum.

What is claimed is:

1. A process for interrupting an ion beam while minimizing the lateral deflection thereof which comprises passing a collimated ion beam through selected areas of a thin monocrystalline membrane, whereby atomic lattice resistance to ion transmission is minimized.

2. The process defined in claim 1 wherein said membrane is less than 2 micrometers in thickness.

3. The process defined in claim 1 which includes passing ions through said membrane in a direction normal to the (110) crystallographic plane thereof, and disposing chosen ion masking regions adjacent to one surface of said membrane and positioned to selectively interrupt said ion beam in a desired pattern.

4. A process for selectively interrupting a collimated ion beam which comprises:
   (a) providing ion absorption regions at one surface of a thin membrane of a chosen monocrystalline material cut on a crystal plane presenting a minimum of atomic lattice resistance to ions passing therethrough; and
   (b) projecting said collimated ion beam perpendicular to said one surface and crystal plane of said membrane, whereby lateral deflection of said ion beam is minimized as it passes through said membrane.

5. A process for partially interrupting a collimated ion beam in a predetermined pattern while simultaneously minimizing the scatter angle and lateral deflection of the uninterrupted ions, including in combination the steps of:
   (a) providing a thin monocrystalline membrane of less than 2 micrometers thickness and having an ion absorbing region adjacent to one surface thereof which is patterned to correspond to said predetermined pattern in which said ion beam is to be interrupted; and
   (b) projecting a collimated ion beam toward and perpendicular to said membrane and through said membrane between non-absorbing areas adjacent said ion absorbing region; the thin and monocrystalline characteristics of said membrane serving to minimize the resistance of said membrane to the transmission of ions channeling therethrough, whereby said thin membrane introduces a minimum of lateral deflection and scattering of said ion beam relative to its initial direction of movement and greatly enhances the resolution at a target on which said uninterrupted ions may impinge.

6. A process for improving resolution and minimizing ion scattering in ion beam lithography comprising the steps of:
   (a) providing a substrate coated with a layer of ion beam resist at a chosen spaced distance from an ion beam source;
   (b) positioning a thin monocrystalline membrane with an ion absorption mask thereon at a predetermined location between said substrate and said ion beam source; and
   (c) passing a collimated wide area ion beam normal to the surface of said membrane and through a plurality of crystal lattice channels therein exposed by said ion absorption mask and which extend perpendicular to said membrane surface, whereby the parallel paths established by said channels provide a minimum of membrane resistance to the passage of ion beams and thereby minimize the angle of lateral scattering of ions passing from said membrane to said layer of resist.

7. A process for improving resolution and minimizing ion scattering in ion beam lithography comprising:
   (a) providing a substrate coated with a layer of ion beam resist at a chosen spaced distance from an ion beam source;
   (b) positioning a membrane of monocrystalline silicon less than about 2 micrometers in thickness at a predetermined location between said substrate and said ion beam source, said membrane having a surface parallel to the (110) crystal plane, and having an ion absorption mask thereon; and
   (c) passing a collimated wide area ion beam normal to the surface of said membrane and through a plurality of crystal lattice channels therein exposed by said ion absorption mask and which extend perpendicular to said membrane surface, whereby the membrane ion travel distance is minimized and the membrane ion transmission is maximized.

8. A process for improving resolution and minimizing ion scattering in ion beam lithography comprising:
   (a) providing a substrate coated with a layer of ion beam resist at a chosen spaced distance from an ion beam source;
   (b) positioning a membrane of monocrystalline silicon less than about 2 micrometers in thickness at a predetermined location between said substrate and said ion beam source, said membrane having a surface parallel to the (110) crystal plane, and containing therein a pattern of opaque regions that form an ion absorption mask; and
   (c) passing a collimated wide area ion beam normal to the surface of said membrane and through a plurality of crystal lattice channels therein exposed by said ion absorption mask and which extend perpendicular to said membrane surface, whereby the membrane ion travel distance is minimized and the membrane ion transmission is maximized.

9. The process defined in claim 8 which includes forming said opaque regions in said membrane by selectively bombarding said membrane by chosen heavy ions to thereby form spaced apart ion damaged regions therein.

* * * * *

UNITED STATES PATENT AND TRADEMARK OFFICE
CERTIFICATE OF CORRECTION

PATENT NO. : 4,158,141
DATED : June 12, 1979
INVENTOR(S) : ROBERT L. SELIGER and PAUL A. SULLIVAN It is certified that error appears in the above-identified patent and that said Letters Patent are hereby corrected as shown below:

Column 1, line 3, after "PROCESS FOR CHANNELING

ION BEAMS," insert the following:

The Government has rights in this invention pursuant to Contract No. MDA-903-78-C-0305 awarded by the Defense Supply Services.

Signed and Sealed this

Thirteenth Day of January 1981

[SEAL]

Attest:

SIDNEY A. DIAMOND

Attesting Officer

Commissioner of Patents and Trademarks